(12) United States Patent
Luft

(10) Patent No.: US 12,160,213 B1
(45) Date of Patent: Dec. 3, 2024

(54) METHOD AND APPARATUS FOR MONITORING NASAL BREATHING

(71) Applicant: Apple Inc., Cupertino, CA (US)

(72) Inventor: Ido Luft, San Diego, CA (US)

(73) Assignee: Apple Inc., Cupertino, CA (US)

( * ) Notice: Subject to any disclaimer, the term of this patent is extended or adjusted under 35 U.S.C. 154(b) by 74 days.

(21) Appl. No.: 17/820,713

(22) Filed: Aug. 18, 2022

Related U.S. Application Data

(60) Provisional application No. 63/261,609, filed on Sep. 24, 2021.

(51) Int. Cl.
- *H03G 3/30* (2006.01)
- *H03M 1/18* (2006.01)
- *H03M 1/70* (2006.01)

(52) U.S. Cl.
CPC ............ *H03G 3/3005* (2013.01); *H03M 1/18* (2013.01); *H03M 1/70* (2013.01)

(58) Field of Classification Search
CPC ......... H03G 3/3005; H03M 1/18; H03M 1/70
USPC ................................................. 341/139, 155
See application file for complete search history.

(56) References Cited

U.S. PATENT DOCUMENTS

| | | | |
|---|---|---|---|
| 8,485,982 B2* | 7/2013 | Gavish | A61B 5/74 600/529 |
| 9,788,757 B2* | 10/2017 | Bikko | A61B 5/486 |
| 10,589,098 B2 | 3/2020 | Jung | |
| 2005/0005935 A1 | 1/2005 | Gradon | |

OTHER PUBLICATIONS

Maxim Integrated Products, Inc., "MAX9814: Microphone Amplifier with AGC and Low-Noise Microphone Bias," 2016.

* cited by examiner

*Primary Examiner* — Khai M Nguyen
(74) *Attorney, Agent, or Firm* — Blank Rome LLP

(57) ABSTRACT

This disclosure is directed to a nasal breathing monitoring system with an ultrasonic transducer (e.g., a microphone) to be placed on or near the outside of the user's nose and record an audio signal of the sound of the user's breathing. The recorded breathing audio signal may be digitized and analyzed, e.g., based on its spectral characteristics, in order to determine one or more breathing characteristics of the user's breathing. The system may then adjust some system parameter based on the determined one or more breathing characteristics, e.g., a signal gain, a filter, feedback to the user, etc. The system may also use the one or more breathing characteristics to: recognize a particular user, present a breathing exercise to a user, tailor particular user feedback, or compare the user's breathing characteristics to historical breathing data for the user and/or historical breathing data from other users obtained via an anonymized database.

19 Claims, 12 Drawing Sheets

METHOD AND APPARATUS FOR MONITORING NASAL BREATHING

BACKGROUND

This disclosure relates generally to the field of user interactions with wearable electronic devices, and, more specifically, to the field of monitoring and analyzing nasal breathing signatures of the users of such wearable electronic devices. In particular, it has been determined that nasal breathing generates ultrasonic frequencies inside the nasal cavity during a user's breathing cycles.

However, in order to provide highly-accurate and low latency (i.e., real-time or near-real-time, e.g., less than 10 milliseconds) feedback to a user device regarding the user's nasal breathing cycles, appropriate ultrasonic audio signal shaping and signal analysis operations may be performed, such that recognizable and/or classifiable characteristics of the user's nasal breathing signal may be identified and acted upon in an appropriate way.

Thus, what is needed are novel devices and techniques to reliably capture and analyze ultrasonic nasal frequencies emitted by a user during a breathing cycle with very low latency, such that appropriate feedback and/or guidance may be provided to users of such devices, based on characteristics of their breathing cycles.

SUMMARY

In one embodiment, a system for identifying characteristics of nasal breathing from ultrasonic audio signals is described. The system may comprise: an ultrasonic transducer (e.g., a microphone) affixed to a nose-piece and configured to record an analog audio signal corresponding to nasal breathing; an amplifier (e.g., an adjustable or automatic gain amplifier) coupled to the ultrasonic transducer and configured to apply a gain to the analog audio signal; an analog-to-digital converter (ADC) coupled to the amplifier and configured to generate a digital audio signal based on the analog audio signal; one or more processors; and one or more computer readable media comprising computer code executable by the one or more processors to: receive, from the ADC, the digital audio signal corresponding to nasal breathing; determine, based on the digital audio signal, a spectrograph for the digital audio signal; identify, based on the spectrograph, a characteristic of the nasal breathing; and adjust, based on the characteristic of the nasal breathing, a parameter of the system related to recording nasal breathing.

In another embodiment, the techniques performed by the exemplary system described above may be embodied in computer executable program code and stored in a non-transitory storage device.

DETAILED DESCRIPTION

Figure 1:
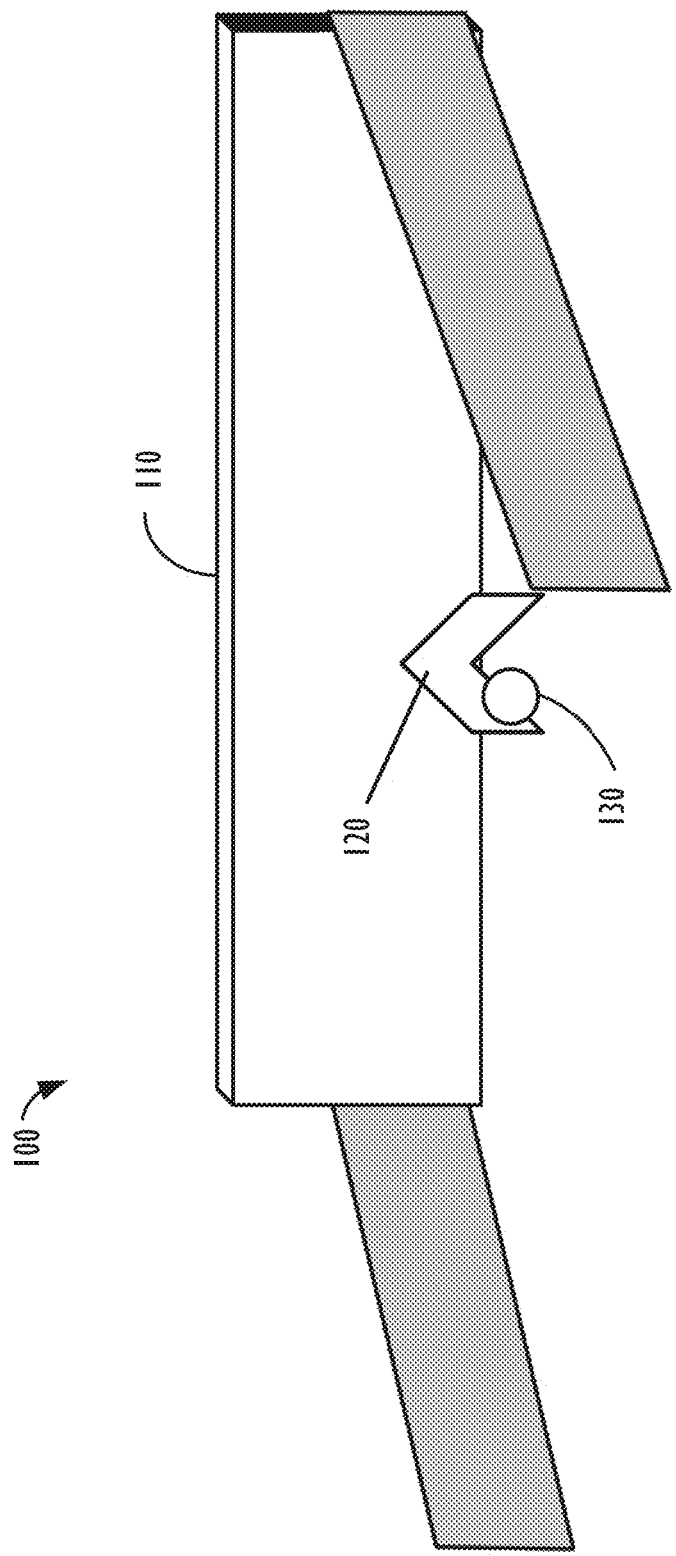
FIG. 1 shows an example of an ultrasonic microphone affixed to a nose-piece of a wearable device, according to one or more embodiments.

This disclosure is directed to systems, methods, and computer readable media for deriving nasal breathing cycles, e.g., for users of wearable devices, such as virtual reality (VR), augmented reality (AR), or extended reality (XR) systems, which may be capable of placing an ultrasonic transducer (e.g., an ultrasonic microphone) in proximity to (e.g., directly on or near) a wearer's nasal cavity. In some embodiments, spectrographs may be made and analyzed for ultrasonic breathing audio signals captured from ultrasonic transducers worn in proximity to the nose of a user of such systems. By identifying and analyzing one or more characteristics of such audio signals, one or more parameters of such systems related to recording nasal breathing may be adjusted and/or appropriate feedback may be delivered to a user of such systems. In particular, the embodiments disclosed herein may allow for low latency (e.g., near real-time) user breathing monitoring and feedback.

In some embodiments, the spectrograph for an obtained breathing audio signal may be filtered. In some such embodiments, at least one of: a frequency range of the filter or a pole of the filter may be adjusted. In further embodiments, the spectrograph for the audio signal may have a frequency range that satisfies a first threshold frequency range criterion, and frequency spurs having a frequency range that does not satisfy a second threshold frequency range criterion may be filtered out.

In other embodiments, the gain of an amplifier may be adjusted during the processing of the audio signal, e.g., in order to compensate for a change in position of a nose-piece having an ultrasonic microphone with respect to the nose of the user of the system, to improve a signal-to-noise ratio (SNR) for the recorded breathing audio signal, etc.

In still other embodiments disclosed herein, an identity of the particular user currently using such a system may be determined, based on one or more characteristics of the nasal breathing.

In yet other embodiments, the system may further comprise a user interface, via which the system may provide a response, alert, or other form of feedback to the particular user currently using the system based, at least in part on an identified one or more characteristics of the particular user's nasal breathing. In some such embodiments, the user interface may present a breathing exercise to be performed by the user, and then provide feedback to the user, based on analyzed characteristics of the particular user's nasal breathing during the breathing exercise. In some cases, the feedback provided to a particular user may be based, at least in part, on historical data indicative of characteristics of nasal breathing during the same type of breathing exercise for one or more other users, e.g., other users that satisfy a similarity criterion with the particular system user.

In further embodiments, obtained audio signal may comprise one or more inhale phases and one or more exhale phases. In such cases, the system may be configured to determine a first spectrograph for an inhale phase of the audio signal and a second spectrograph for an exhale phase of the audio signal. Then, a first characteristic may be identified for the inhale phase of the nasal breathing, while a second characteristic may be identified for the exhale phase of the nasal breathing. Adjustments to the system may then be made based on at least one of: the first (i.e., inhale phase) characteristic and the second (i.e., exhale phase) characteristic.

In the following description, for purposes of explanation, numerous specific details are set forth in order to provide a thorough understanding of the disclosed concepts. As part of this description, some of this disclosure's drawings represent structures and devices in block diagram form in order to avoid obscuring the novel aspects of the disclosed embodiments. In this context, it should be understood that references to numbered drawing elements without associated identifiers refer to all instances of the drawing element with identifiers. Further, as part of this description, some of this disclosure's drawings may be provided in the form of a flow diagram. The boxes in any particular flow diagram may be presented in a particular order. However, it should be understood that the particular flow of any flow diagram is used only to exemplify one embodiment. In other embodiments, any of the various components depicted in the flow diagram may be deleted, or the components may be performed in a different order, or even concurrently. In addition, other embodiments may include additional steps not depicted as part of the flow diagram. The language used in this disclosure has been principally selected for readability and instructional purposes, and it may not have been selected to delineate or circumscribe the disclosed subject matter. Reference in this disclosure to "one embodiment" or to "an embodiment" means that a particular feature, structure, or characteristic described in connection with the embodiment is included in at least one embodiment, and multiple references to "one embodiment" or to "an embodiment" should not be understood as necessarily all referring to the same embodiment or to different embodiments.

It should be appreciated that, in the development of any actual implementation (as in any development project), numerous decisions must be made to achieve the developers' specific goals (e.g., compliance with system and business-related constraints), and that these goals will vary from one implementation to another. It will also be appreciated that such development efforts might be complex and time consuming, but would nevertheless be a routine undertaking for those of ordinary skill in the art of image capture having the benefit of this disclosure.

For purposes of this disclosure, the term "camera system" refers to one or more lens assemblies along with the one or more sensor elements and other circuitry utilized to capture an image. For purposes of this disclosure, a "camera system" may include more than one camera, such as a stereo camera system, a multi-camera system, or a camera system capable of sensing the depth of a captured scene.

A physical environment refers to a physical world that people can sense and/or interact with without aid of electronic devices. The physical environment may include physical features such as a physical surface or a physical object. For example, the physical environment corresponds to a physical park that includes physical trees, physical buildings, and physical people. People can directly sense and/or interact with the physical environment such as through sight, touch, hearing, taste, and smell. In contrast, an extended reality (XR) environment refers to a wholly or partially simulated environment that people sense and/or interact with via an electronic device. For example, the XR environment may include augmented reality (AR) content, mixed reality (MR) content, virtual reality (VR) content, and/or the like. With an XR system, a subset of a person's physical motions, or representations thereof, are tracked, and, in response, one or more characteristics of one or more virtual objects simulated in the XR environment are adjusted in a manner that comports with at least one law of physics. As one example, the XR system may detect head movement and, in response, adjust graphical content and an acoustic field presented to the person in a manner similar to how such views and sounds would change in a physical environment. As another example, the XR system may detect movement of the electronic device presenting the XR environment (e.g., a mobile phone, a tablet, a laptop, or the like) and, in response, adjust graphical content and an acoustic field presented to the person in a manner similar to how such views and sounds would change in a physical environment. In some situations (e.g., for accessibility reasons), the XR system may adjust characteristic(s) of graphical content in the XR environment in response to representations of physical motions (e.g., vocal commands).

There are many different types of electronic systems that enable a person to sense and/or interact with various XR environments. Examples include head mountable systems, projection-based systems, heads-up displays (HUDs), vehicle windshields having integrated display capability, windows having integrated display capability, displays formed as lenses designed to be placed on a person's eyes (e.g., similar to contact lenses), headphones/earphones, speaker arrays, input systems (e.g., wearable or handheld controllers with or without haptic feedback), smartphones, tablets, and desktop/laptop computers. A head mountable system (e.g., an HMD) may have one or more speaker(s) and an integrated opaque display. Alternatively, a head mountable system may be configured to accept an external opaque display (e.g., a smartphone). The head mountable system may incorporate one or more imaging sensors to capture images or video of the physical environment, and/or one or more microphones to capture audio of the physical environment. Rather than an opaque display, a head mountable system may have a transparent or translucent display. The transparent or translucent display may have a medium through which light representative of images is directed to a person's eyes. The display may utilize digital light projection, OLEDs, LEDs, uLEDs, liquid crystal on silicon, laser scanning light source, or any combination of these technologies. The medium may be an optical waveguide, a hologram medium, an optical combiner, an optical reflector, or any combination thereof. In some implementations, the transparent or translucent display may be configured to become opaque selectively. Projection-based systems may employ retinal projection technology that projects graphical images onto a person's retina. Projection systems also may be configured to project virtual objects into the physical environment, for example, as a hologram or on a physical surface.

Exemplary Wearable Devices with Ultrasonic Transducers

Turning now to FIG. 1, an example of an ultrasonic transducer, i.e., ultrasonic microphone 130, affixed to a nose-piece 120 of an exemplary wearable device 100 (e.g., eyeglasses or other HMD) is shown, according to one or more embodiments. Ultrasonic microphone 130 may comprise a transducer capable of recording audio signals in the frequency range of 20 kHz or higher (e.g., up to 300 kHz). According to the various filtering techniques disclosed herein, the audio signals obtained from ultrasonic microphones may be made fairly immune to vibrations and user speech patterns (e.g., modifying signal gain and/or by focusing analysis on signals in the aforementioned range of 20 kHz to 300 kHz). The obtained audio signals may also be processed such that they are fairly robust in terms of placement with respect to a user's nasal cavity (again by modifying signal gain and/or performing frequency filtering), thereby making it possible to use such ultrasonic microphones in a wide variety of locations on or around a user's nose. This robustness allows for the compensation of different mechanical configurations and system design constraints, while still obtaining the signal with an adequate SNR. Ultrasonic microphones are also fairly low-cost. Each of these factors makes them a good choice for inclusion in the various breathing cycle analysis devices that will be described further herein. As illustrated, in some embodiments, ultrasonic microphone 130 may be affixed to a nose-piece 120, e.g., that is part of a wearable device 100. For example, the wearable device 100 may be a head-mounted device and may include a display 110 that is worn in front of a user's eyes. The nose-piece 120 supports the display 110 on the user's nose and positions the ultrasonic microphone 130 on the user's nose. In some embodiments, the position of the nose-piece 120 with respect to the user's nose may be adjustable, e.g., based on the user's comfort, size, and/or device-wearing position, etc.

Ideally, the ultrasonic microphone 130 is positioned at a stable location, as close to the nasal cavity of the user as is comfortable for the user, and free of any other blockages or obstructions. However, as described below, different filtering techniques may need to be applied to the recorded audio signal, based on the precise location of the ultrasonic microphone 130 during recording, to ensure that a usable breathing audio signal is still recorded by the device.

Exemplary Digital Audio Processing Systems

Figure 2A:
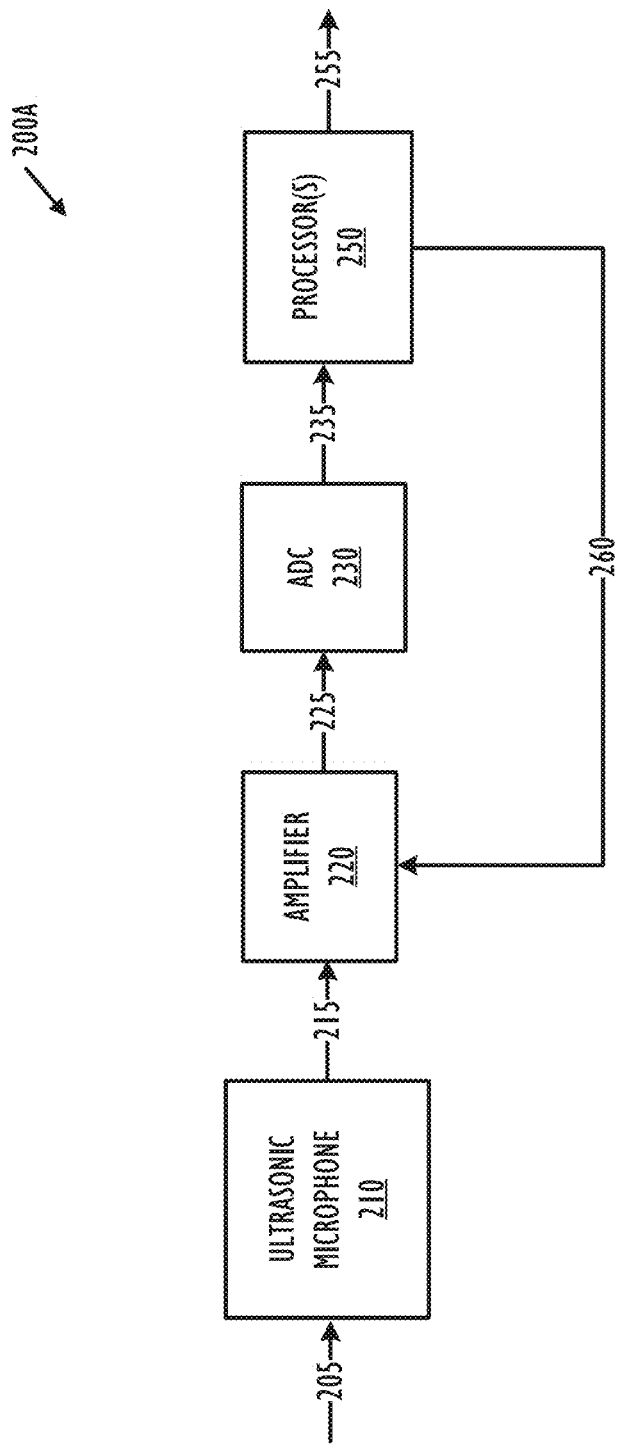
FIGS. 2A and 2B show exemplary systems for processing digital audio signals, according to one or more embodiments.
Figure 2B:
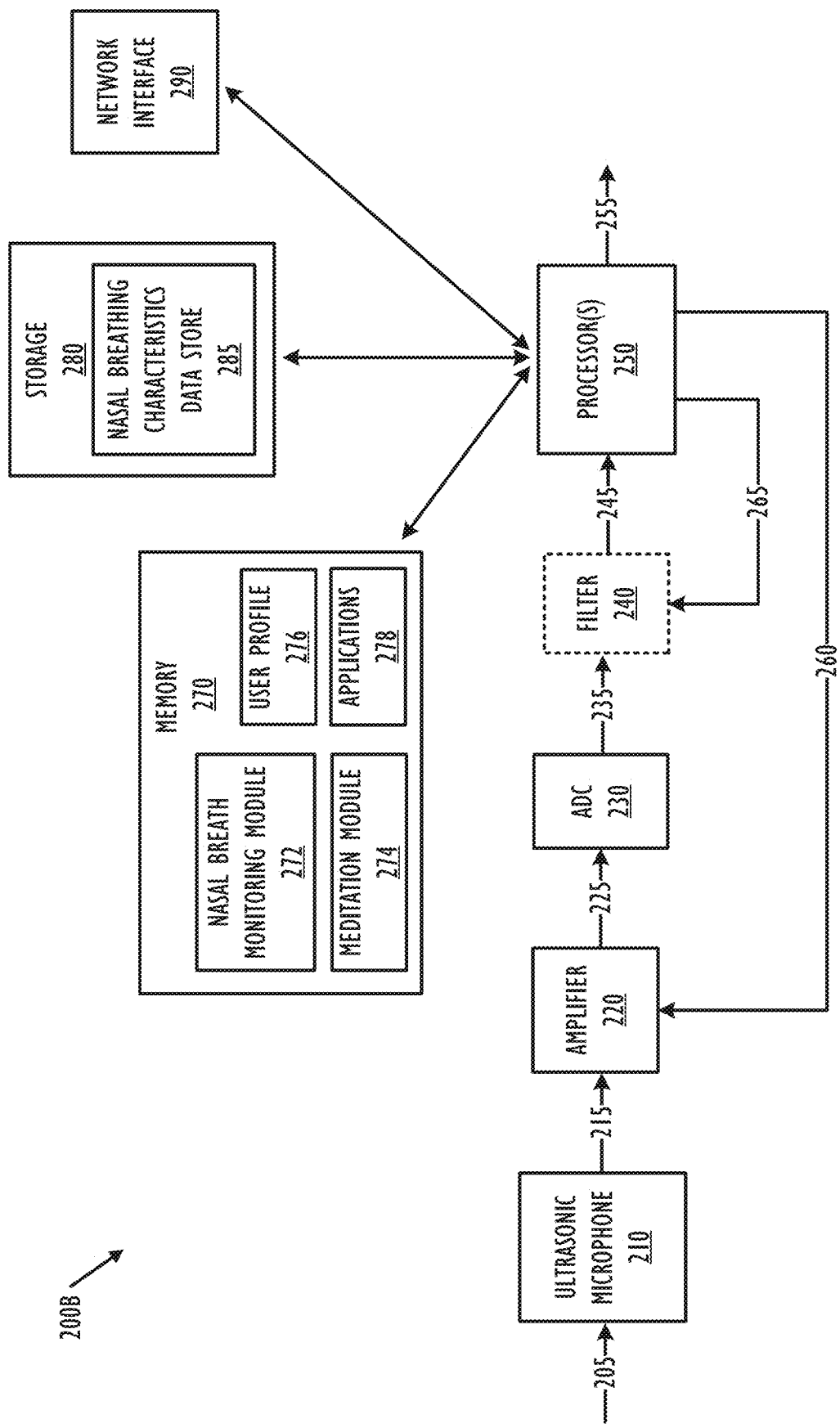

FIGS. 2A and 2B show exemplary systems for processing digital audio signals, according to one or more embodiments. Turning first to FIG. 2A, a block diagram of a device 200A is shown, illustrating a breathing signal 205 that is recorded by an ultrasonic microphone 210, thereby producing a recording of the user's breathing, e.g., in the form of analog audio signal 215. In some instances, the ultrasonic microphone 210 may be constantly recording, while, in other instances, it may be recording only during prespecified time intervals, at the request of a user, and/or during the use of particular device applications, e.g., those that monitor and/or analyze a user's breathing cycles in real-time or near-real-time.

In some embodiments, analog audio signal 215 may be passed through an amplifier 220, e.g. an adjustable gain amplifier or automatic gain amplifier that is configured to apply a gain to the analog audio signal 215, producing amplified output signal 225. As mentioned above, the precise placement of the ultrasonic microphone 210 with respect to the nasal cavity of the wearing user may affect the amount of amplification (if any) needed to be applied by amplifier 220. In some cases, a device may record a first set of breathing cycles (e.g., 4-5 breathing cycles) to obtain a baseline signal level, then automatically adjust the amplification and/or filtering that is applied to the signal, based on what is needed to get the most usable audio signal data. In other cases, such devices may perform this automatic adjustment during normal device operations (e.g., if a user slightly changes the position of the device with respect to their head or nose, etc.), or at any time that the recorded audio signal changes more than a threshold amount and/or becomes less optimal from a breathing characteristic analysis standpoint (e.g., to improve SNR).

Amplified output signal 225 may then be coupled to analog-to-digital converter (ADC) 235, thereby generating digital audio signal 235. Finally, digital signal processor 250 may receive digital audio signal 235 and take any further desired processing operations (e.g., filtering, noise removal, etc.), resulting in output signal 255, which may comprise an output digital audio signal and/or some other control signal, e.g., prompting some action by at least one other component in the device 200A, e.g., a feedback signal to a breathing-related application, based on one or more characteristics of the digital audio signal 235. If desired, processor 250 may also provide a feedback signal 260 to one or more elements of the signal processing chain, e.g., based on its analysis of the digital audio signal 235. For example, in some instances, feedback signal 260 may comprise a command to cause amplifier 220 to change the amount of amplification it is applying to the analog audio signal 215.

Turning now to FIG. 2B, another block diagram is shown, illustrating additional features of the audio signal processing pipeline introduced in FIG. 2A. For example, device 200B includes an optional filter module 240 between ADC 230 and processor 250, which may be controlled by processor 250 via control signal 265, e.g., to apply additional filtering to the digital audio signal, as needed, and produce filtered digital audio signal 245. For example, in some instances, it may be beneficial to apply one or more high-pass frequency filters to the digital audio signal 235 at optional filter module 240. In some implementations, filter 240 is an analog filter between amplifier 220 and ADC 230. The amplified output signal 225 is input to the analog filter 240, which outputs a filtered output signal 245 to the ADC 230.

Device 200B also contains other additional components that the processor 250 may communicate with, such as: a memory 270 (in which various components may be stored, such as a nasal breath monitoring module 272, a meditation module 274, user profile information 276, and/or other applications 278, which may or may not be related to nasal breathing); storage 280 (e.g., persistent storage including a nasal breathing characteristics data store 285, which may contain historical data indicative of characteristics of nasal breathing for the current user of the device and/or for one or more additional users); and network interface 290 (e.g., to allow the device to communicate with an external server device or other devices).

Nasal breath monitoring module 272 may comprise an application executing on a smartphone, wearable device, or other device, and configured to monitor a user's nasal breathing, provide breathing exercises to the user, and/or provide feedback or other alerts to the user related to their breathing. Meditation module 274 may comprise an application executing on a smartphone, wearable device, or other device, and configured to guide a user through a meditation exercise, which may also rely on the analysis of a user's breathing. User profile 276 may comprise multiple elements related to the user, e.g.: the user's age, gender, relevant health data, e.g., underlying respiratory conditions, and/or data related to historical nasal breathing characteristics of the user. As will be described in greater detail below, nasal breathing characteristics data store 285 may be used to store historical breathing characteristics (and/or signals), e.g., to provide comparison points for currently-recorded audio signals and/or aid in the further analysis of recorded audio signals.

Exemplary Network-Connected Electronic Devices

Figure 3:
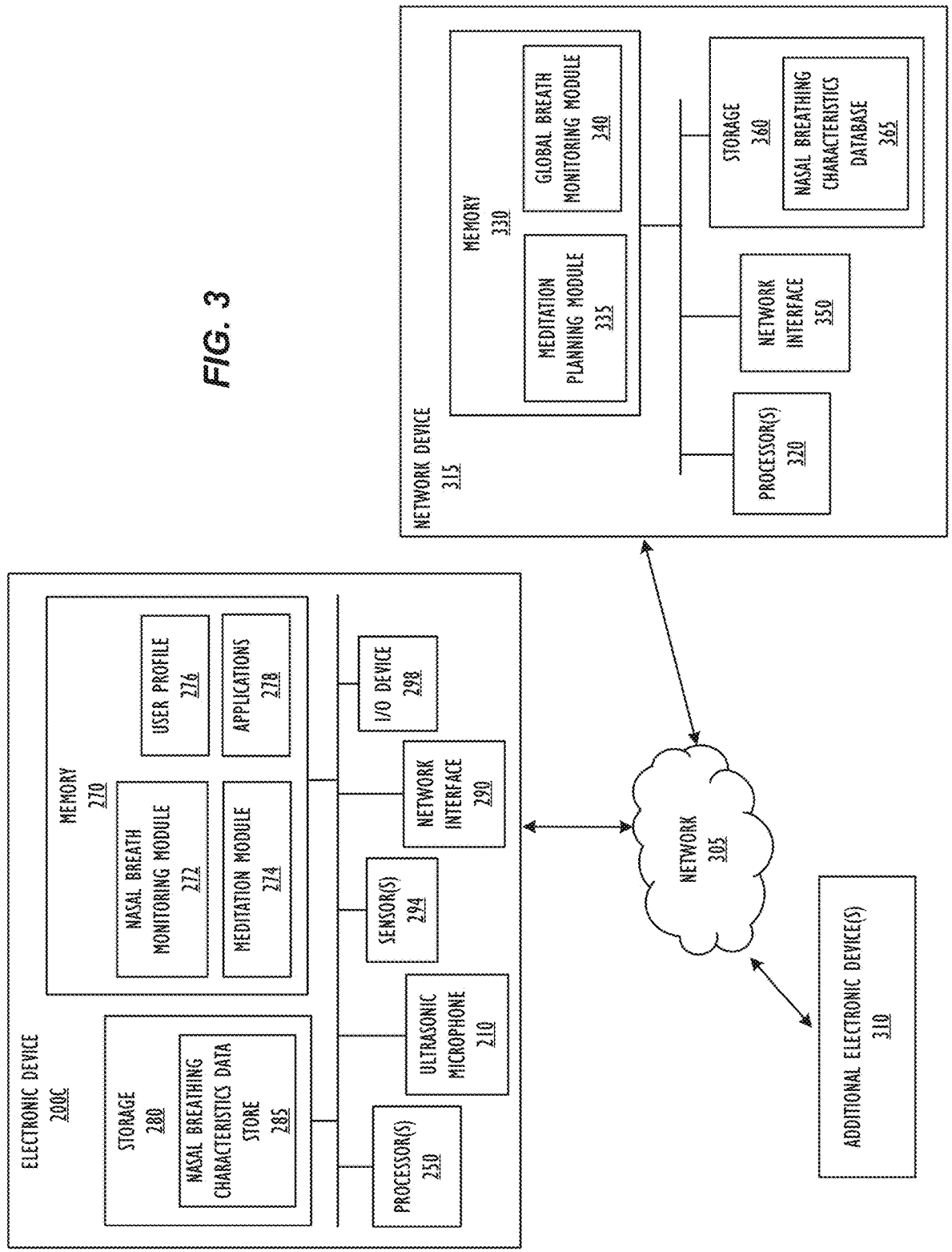
FIG. 3 shows an example of network-connected electronic devices for identifying characteristics of nasal breathing, according to one or more embodiments.

Referring now to FIG. 3, an example of network-connected electronic devices for identifying characteristics of nasal breathing is depicted. For example, electronic device 200C is shown as being communicably connected to additional electronic devices 310 and other network device(s) 315 over a network 305, in accordance with one or more embodiments of the disclosure.

Electronic device 200C may be part of a multifunctional device, such as a mobile phone, tablet computer, personal digital assistant, portable music/video player, wearable device, head-mounted system, projection-based systems, base station, laptop computer, desktop computer, network device, or any other electronic systems such as those described herein. Electronic device 200C, additional electronic device(s) 310, and/or network device(s) 315 may additionally, or alternatively, include one or more additional devices within which the various functionality may be contained, or across which the various functionality may be distributed, such as server devices, base stations, accessory devices, and the like.

Illustrative networks, such as network 305 include, but are not limited to, a local network such as a universal serial bus (USB) network, an organization's local area network, and a wide area network such as the Internet. According to one or more embodiments, electronic device 200C may be utilized to participate in a single-user or multi-user meditation session (or other breathing-related exercise) in an XR environment. It should be understood that the various components and functionality within electronic device 200C, additional electronic device 310 and network device 315 may be differently distributed across the devices, or they may be distributed across additional devices.

Electronic device 200C may include one or more processors 250, such as a central processing unit (CPU). Processor(s) 250 may include a system-on-chip such as those found in mobile devices and include one or more dedicated graphics processing units (GPUs). Further, processor(s) 250 may include multiple processors of the same or different type. Electronic device 200C may also include a memory 270. Memory 270 may include one or more different types of memory, which may be used for performing device functions in conjunction with processor(s) 250. For example, memory 270 may include cache, ROM, RAM, or any kind of transitory or non-transitory computer readable storage medium capable of storing computer readable code. As described above, memory 270 may store various programming modules for execution by processor(s) 250, including nasal breath monitoring module 272, meditation module 274, user profile information 276, and other various applications 278. Electronic device 200C may also include storage 280, which, as discussed above, may store the nasal breaching characteristics data store 285. Storage 280 may include one more non-transitory computer-readable mediums including, for example, magnetic disks (fixed, floppy, and removable) and tape, optical media such as CD-ROMs and digital video disks (DVDs), and semiconductor memory devices such as Electrically Programmable Read-Only Memory (EPROM), and Electrically Erasable Programmable Read-Only Memory (EEPROM). Electronic device 200C may additionally include a network interface 290, from which the electronic device 200C can communicate across network 305.

Electronic device 200C may also include one or more ultrasonic microphones 210 or other sensors 294, such as camera image sensors, transducers, positional sensors, motion sensors, or depth sensor(s), i.e., sensors from which depth or other characteristics of an environment may be determined. In one or more embodiments, one or more of the camera image sensors may be part of a traditional RGB camera, or a depth camera. Further, the cameras of device 200C may include a stereo- or other multi-camera system, a time-of-flight camera system, or the like.

Electronic device 200C may also include one or more input/output device 298, such as a display device. The display device may utilize digital light projection, OLEDs, LEDs, ULEDs, liquid crystal on silicon, laser scanning light source, or any combination of these technologies. The medium may be an optical waveguide, a hologram medium, an optical combiner, an optical reflector, or any combination thereof. In one embodiment, the transparent or translucent display may be configured to become opaque selectively. Projection-based systems may employ retinal projection technology that projects graphical images onto a person's retina. Projection systems also may be configured to project virtual objects into the physical environment, for example, as a hologram or on a physical surface.

According to one or more embodiments, memory 270 may include one or more modules that comprise computer readable code executable by the processor(s) 250 to perform functions related to the analysis of characteristics of nasal breathing. The device 200C may also be operated within a computing environment which supports a single user experience by electronic device 200C, as well as a shared, multiuser experience, e.g., involving collaboration with an additional electronic device(s) 310.

Although electronic device 200C is depicted as comprising the numerous components described above, in one or more embodiments, the various components may be distributed across multiple devices. Accordingly, although certain processes are described herein, with respect to the particular systems as depicted, in one or more embodiments, the various processes may be performed differently, based on the differently-distributed functionality. Further, additional components may be used, some combination of the functionality of any of the components may be combined.

Network device 315 may be an electronic device possessing similar components and/or functionality to electronic device 200C, but available to electronic device 200C across network 305, and possibly capable of analyzing data and/or orchestrating actions across multiple individual electronic devices engaged in the analysis of characteristics of user breathing data. Network device 315 may further comprise: processor(s) 320; network interface 350; memory 330; and storage 360. In this example, memory 330 may store various programming modules for execution by processor(s) 320, including meditation planning module 335, global breath monitoring module 340, and/or other various applications. Meditation planning module 335 may be part of an application that designs, plans, and/or distributes meditation exercises (and/or other breathing-related exercises) to various other electronic devices 200C/310 across network 305. Global breath monitoring module 340 may be part of an application that tracks, stores, and/or analyzes breathing information from various users, e.g., in an anonymized fashion, so that it might distribute breathing-related information, insights, feedback or alerts to various other electronic devices 200C/310 across network 305. Storage 360 may contain a nasal breathing characteristics database 365, e.g., for storing global breathing-related information, which, as described above, may be distributed, in the form of breathing-related information, insights, feedback or alerts to various other electronic devices 200C/310 across network 305. In some cases, nasal breathing characteristics database 365 may contain information and/or exemplary signal data representative of particular respiratory conditions (e.g., excitement, panic attack, hyperventilation, meditation, sleep, illness, unconsciousness, etc.), such that characteristics of recorded breathing audio signal may be compared against those conditions and be identifiable in real-time or near-real-time in devices being worn by users who may be experiencing such conditions. In some implementations, the meditation planning module 335 may develop meditation exercises and/or other breathing-related exercises based on the breathing-related information developed by global breath monitoring module 340 and the global breathing-related information stored in the nasal breathing characteristics database 365. For example, the meditation planning module 335 may develop a particular breath exercise for users having a shared characteristic, such as age, health condition, and the like.

Methods for Identifying Characteristics of Nasal Breathing

Figure 4:
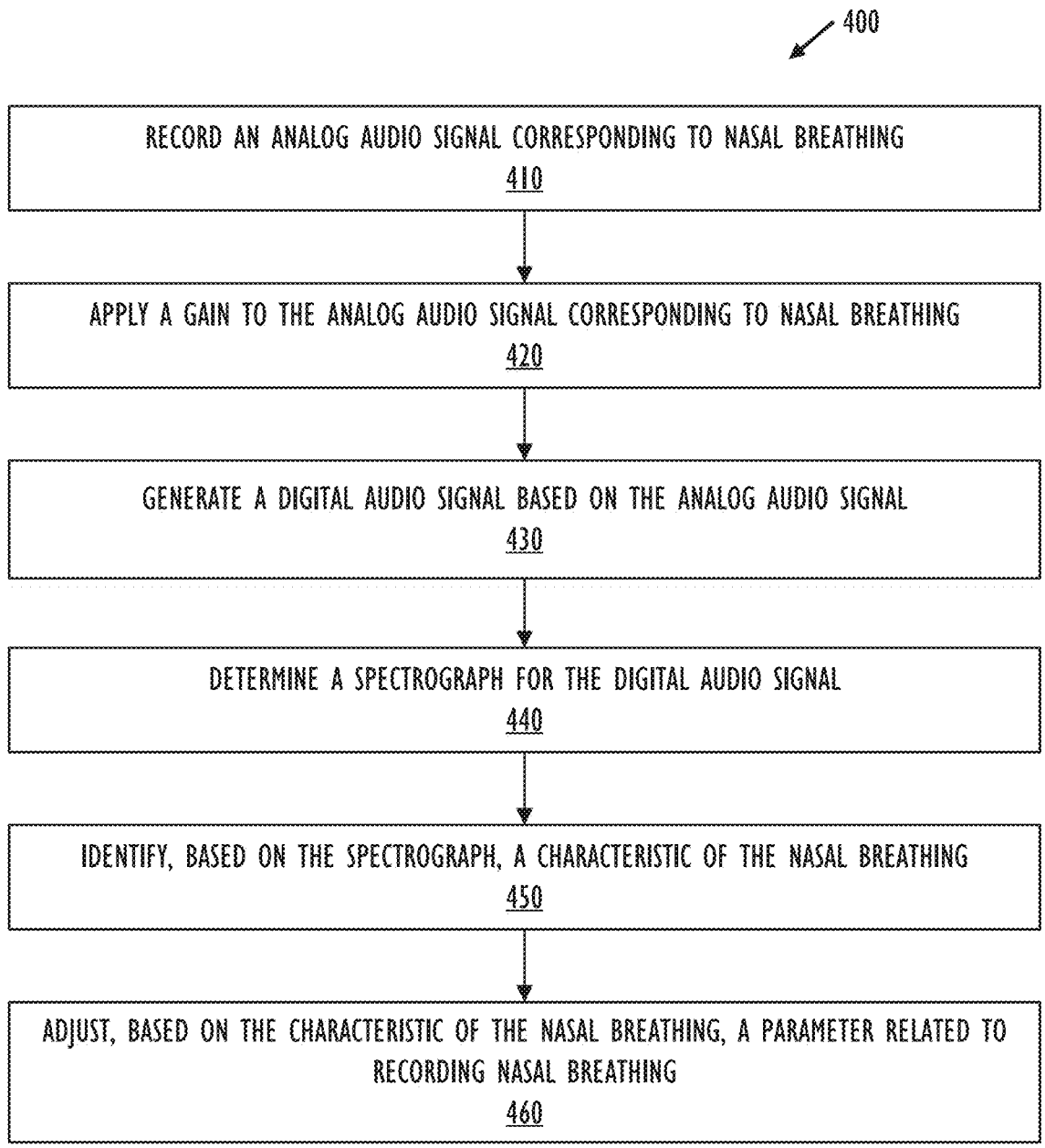
FIG. 4 shows, in flow chart form, an example technique for identifying characteristics of nasal breathing, according to one or more embodiments.

FIG. 4 shows, in flow chart form, an example technique 400 for identifying characteristics of nasal breathing, according to one or more embodiments. For purposes of explanation, the following steps will be described in the context of the various embodiments and devices described herein. However, it should be understood that the various actions may be taken by alternate components. In addition, the various actions may be performed in a different order. Further, some actions may be performed simultaneously, and some may not be required, or others may be added.

The flowchart begins at block 410, wherein an analog audio signal is recorded, e.g., by a user-worn system included a nose-piece comprising an ultrasonic microphone, wherein the audio signal corresponds to the user's nasal breathing. Next, at block 420, a gain (e.g., an adjustable and/or automatically determined gain) may be applied to the analog audio signal corresponding to nasal breathing. Next, at block 430, a digital audio signal may be generated based on the analog audio signal.

Next, at block 440, a spectrograph may be determined for the digital audio signal, as will be discussed in greater detail below with reference to FIG. 5 and FIG. 8. A spectrograph may show the amplitude of the recorded audio signal across a range of frequencies (e.g., ultrasonic frequencies typically associated with nasal breathing) and may be used to identify one or more relevant characteristics of the user's nasal breathing.

Next, at block 450, a characteristic of the nasal breathing may be identified based, at least in part, on the determined spectrograph. For example, the rate of the nasal breathing, the type of nasal breathing (e.g., inhalation versus exhalation), the depth of the nasal breathing, etc., may each be identified, at least in part, based on the analysis of the determined spectrograph. Finally, at block 460, at least one parameter of the user-worn system related to recording nasal breathing (e.g., the amplification and/or filtering applied to the recorded audio signal) may be adjusted based on the identified characteristic of the user's nasal breathing.

Figure 5:
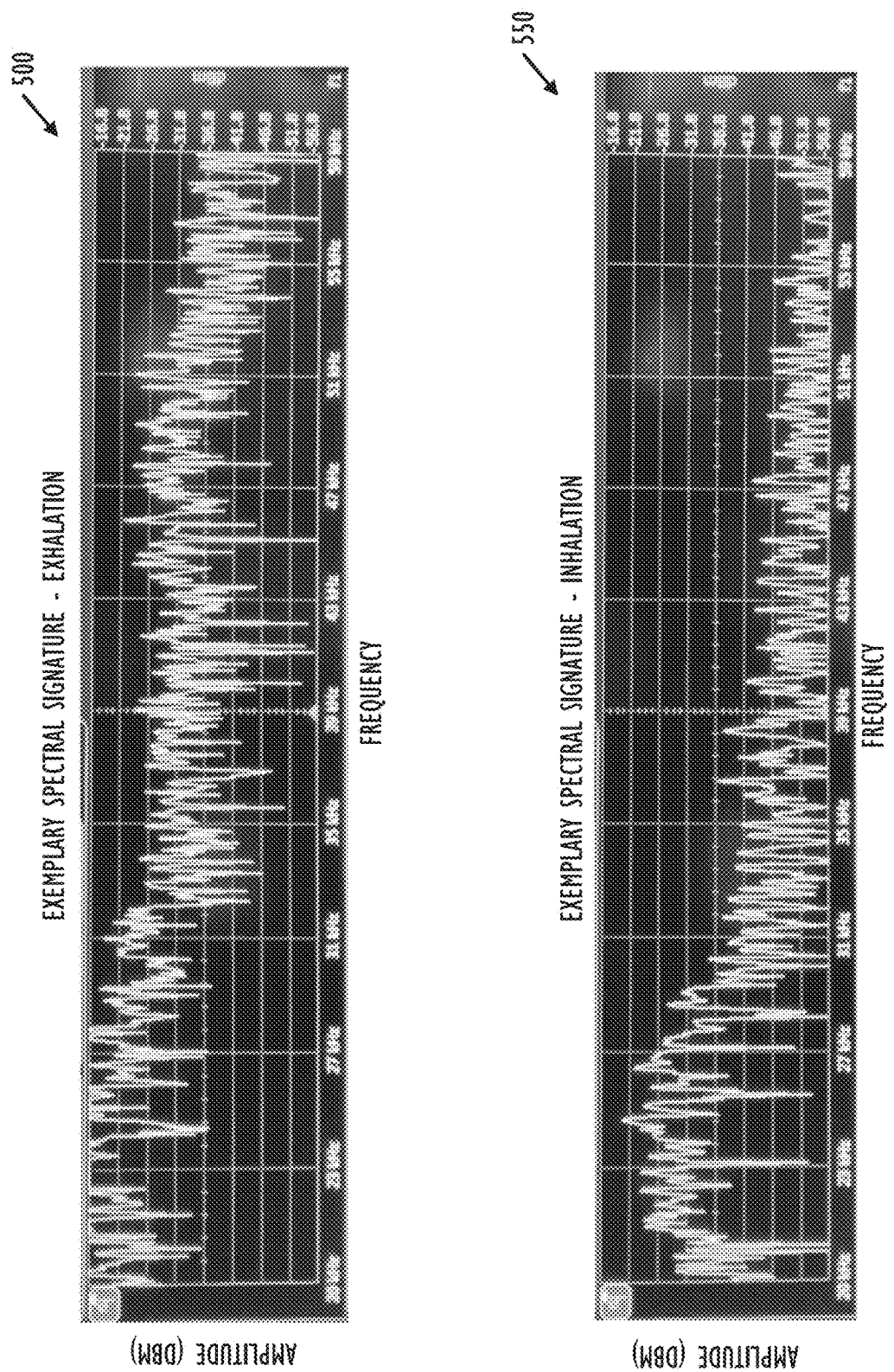
FIG. 5 shows exemplary spectral signatures for an inhale phase and an exhale phase of a nasal breathing signal, according to one or more embodiments.

FIG. 5 shows exemplary spectral signatures for an inhale phase (500) and an exhale phase (550) of a nasal breathing signal, according to one or more embodiments. In these spectrographs, amplitude is shown on the vertical axis (in dBm), and frequency is shown on the horizontal axis (in kHz), e.g., beginning with so-called "ultrasonic" frequencies of 20 kHz and higher. In exemplary exhalation spectral signature 500, it is illustrated that the portion of the signal in the lower ultrasonic frequency range (e.g., between 20 kHz and 39 kHz) generally has higher amplitude than the signal in the upper ultrasonic frequency range (e.g., between 39 kHz and 59 kHz). In the exemplary inhalation spectral signature 550, it is also illustrated that that the portion of the signal in the lower ultrasonic frequency range (e.g., between 20 kHz and 39 kHz) generally has higher amplitude than the signal in the upper ultrasonic frequency range (e.g., between 39 kHz and 59 kHz), but that the inhalation audio signal shows an overall lower average signal amplitude than the exhalation audio signal. Additionally, each spectral signature 500 and 550 has a unique spectral composition (e.g., as would be observed by applying a Fast Fourier Transform (FFT) to the respective audio signals in the range of 30 kHz to 100 kHz), which may allow a digital signal processor to perform calibration operations and/or make very rapid (e.g., in real-time or near-real-time) assessments of whether a given portion of a recorded audio signal relates to an inhalation phase or an exhalation phase of a breathing cycle. In some embodiments, devices as described herein may be capable of recognizing and distinguishing between inhalation and exhalation "signatures" across different users—and even between different times and use conditions per each individual user, while still accurately capturing and using such audio signal data.

Figure 6:
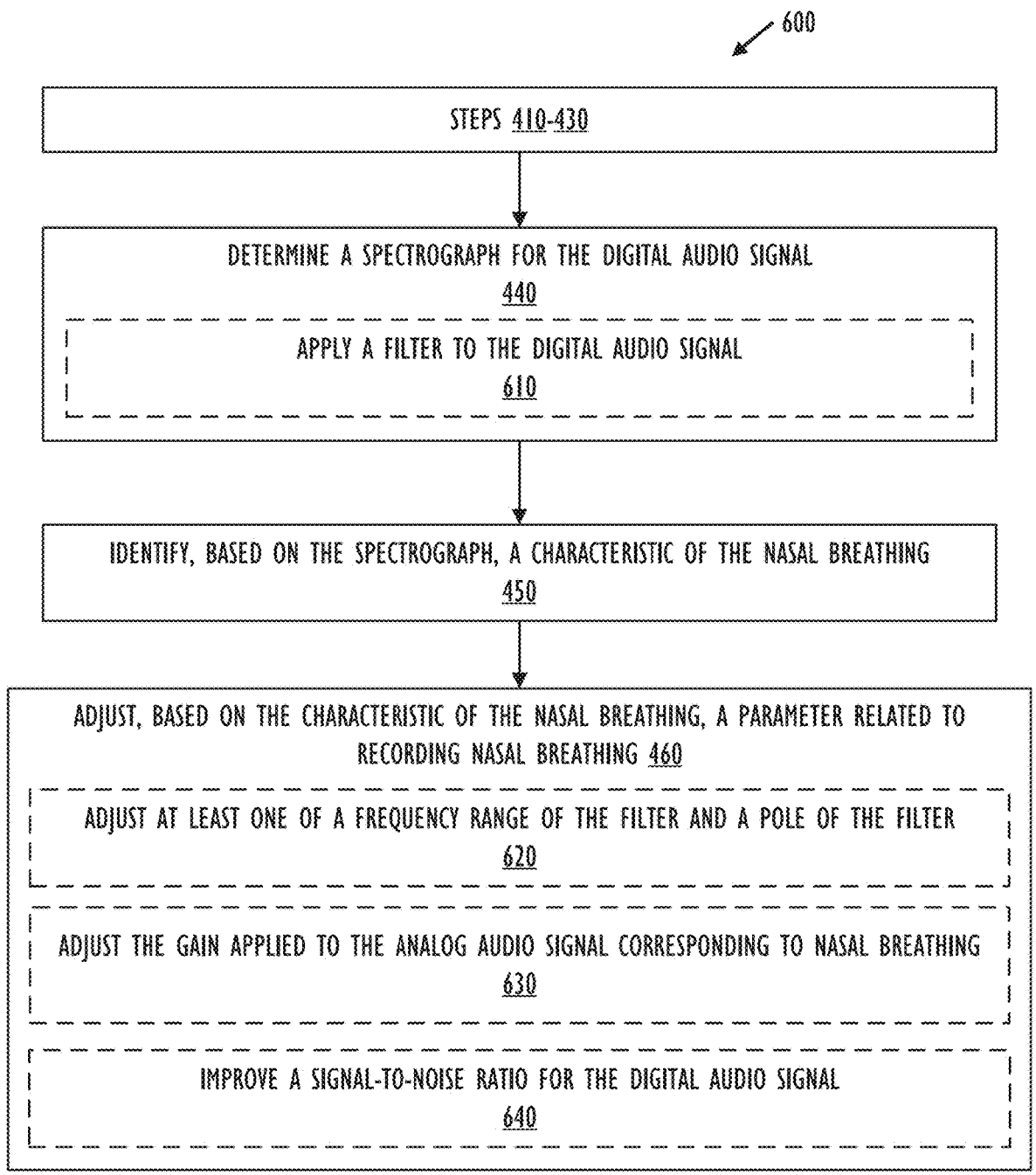
FIG. 6 shows, in flow chart form, an example technique for adjusting various parameters of a wearable device based on identified characteristics of nasal breathing, according to one or more embodiments.

FIG. 6 shows, in flow chart form, an example technique 600 for adjusting various parameters of a wearable device related to recording nasal breathing based on identified characteristics of nasal breathing, according to one or more embodiments. Referring back to FIG. 4 and technique 400, block 610 provides additional detail to block 440 from FIG. 4. In particular, block 610 provides that a filter may be applied to the spectrograph determined for the digital audio signal. In some examples, the filter may comprise a particular frequency range and/or poles that the system uses to filter the recorded audio signal data. Next, FIG. 6 provides additional detail to block 460 from FIG. 4. In particular, system parameters that may be adjusted, based on the one or more characteristics of the nasal breathing audio signal, may comprise: at least one of a frequency range of the filter and a pole of the filter (block 620); the gain applied to the analog audio signal corresponding to nasal breathing (block 630); or other parameters designed to improve a signal-to-noise ratio for the digital audio signal (block 640). As may now be understood, by changing the gain, amplification, filters, frequency ranges, etc., of the digital audio signal, the frequency response of the analog signal chain can be compensated for in near-real-time in the digital domain, allowing further optimization of the signal processing (e.g., smart filtering, interference removal, etc.), in order to identify the most salient portions of the audio signal for breathing-related analysis. In some embodiments, machine learning (ML)-enabled techniques could be applied to the identified characteristics of the nasal breathing signal, e.g., in order to help decide how to determine what device parameters to adjust (and/or to what extent they should be adjusted), perform spectrum analysis, and/or other SNR optimizations on the recorded breathing signal.

Figure 7:
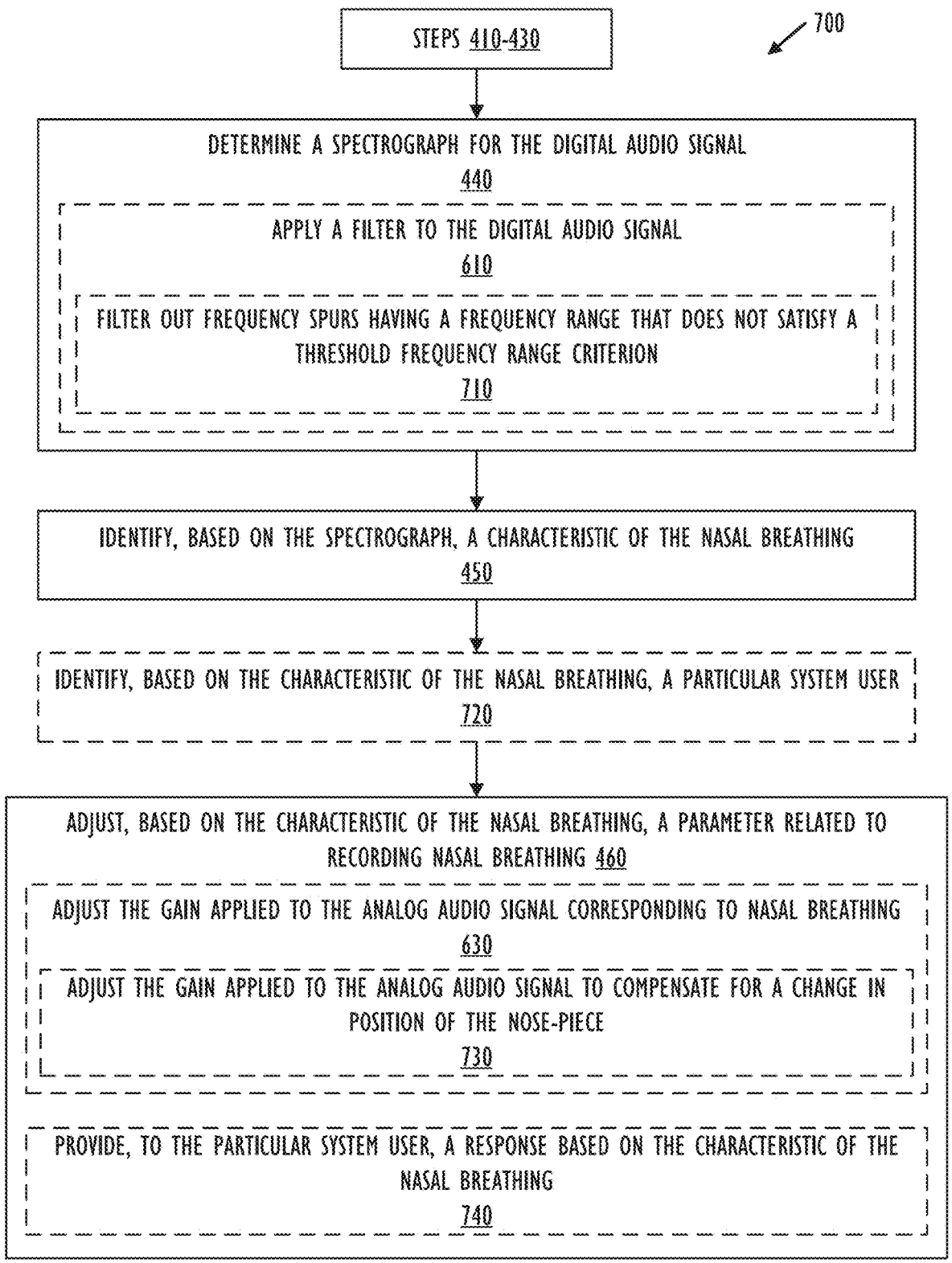
FIG. 7 shows, in flow chart form, other exemplary techniques for adjusting various parameters of a wearable device based on identified characteristics of nasal breathing, according to one or more embodiments.

FIG. 7 shows, in flow chart form, other exemplary techniques 700 for adjusting various parameters of a wearable device related to recording nasal breathing based on identified characteristics of nasal breathing, according to one or more embodiments. Referring back to FIGS. 4 and 6, block 710 provides additional detail to block 440 from FIG. 4 and block 610 from FIG. 6. In particular, block 710 provides that the filtering of the digital audio signal may comprise filtering out frequency spurs having a frequency range that does not satisfy a threshold frequency range criterion (e.g., frequency components that appear in signals because of electromagnetic (EM) noise caused by the electrical components of the recording instrument itself).

Figure 8:
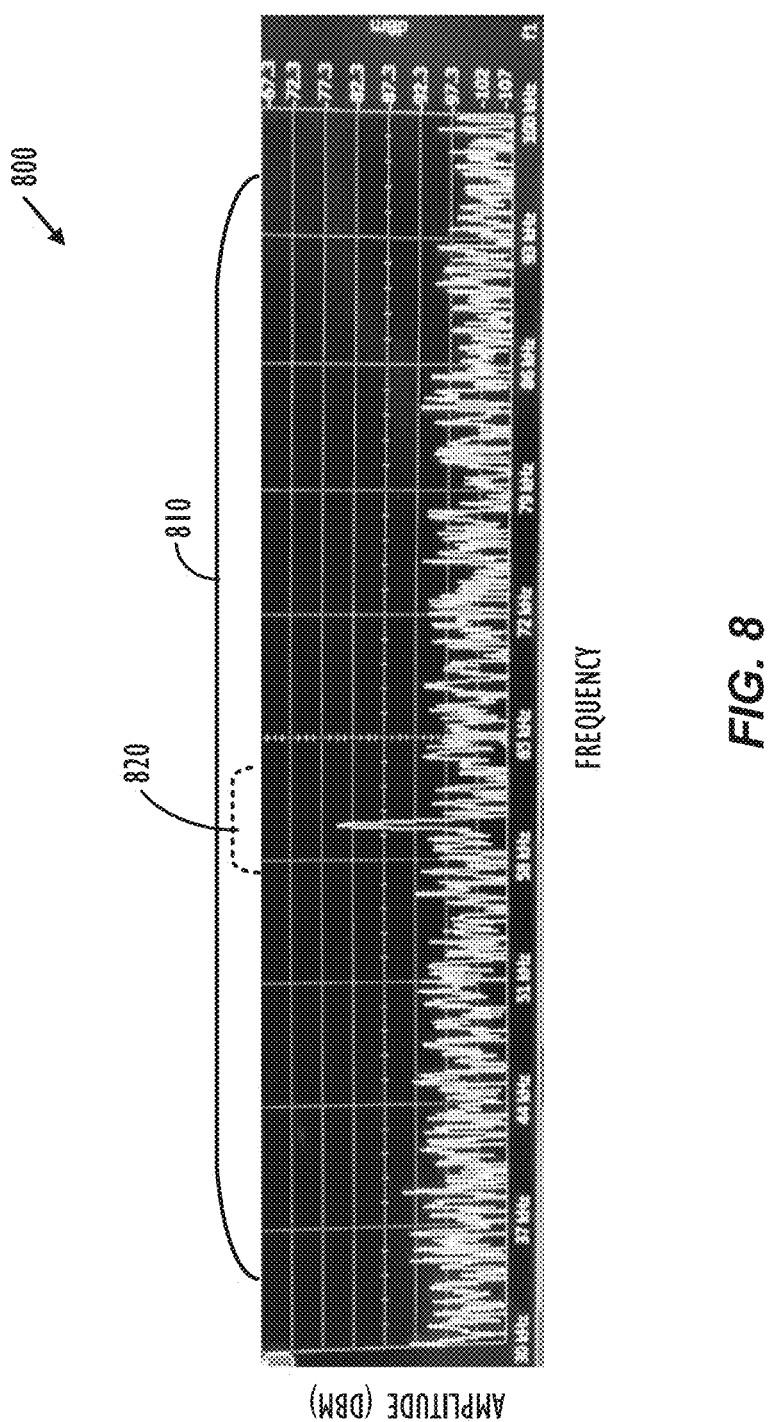
FIG. 8 shows characteristics of an exemplary spectral signature for a nasal breathing signal, according to one or more embodiments.

As illustrated in the exemplary spectral signature 800 for a nasal breathing signal shown in FIG. 8, the portion of the ultrasonic frequency spectrum related to the sounds of the user's nasal breathing (810) is much wider than the frequency range of individual noise peaks (820) or spurs, thus allowing such noise peaks (or other spurious signals or EM noise in the system) to be filtered from the audio signal before being further analyzed to identify characteristics of the user's breathing. As discussed above with respect to FIG. 5, in this spectrograph, amplitude is shown on the vertical axis (in dBm), and frequency is shown on the horizontal axis (in kHz). For example, the threshold frequency range criterion in block 710 may be a frequency range that is less than the wider frequency range 810 of the user's breathing but greater than the frequency range 820 of the noise spur, such that the noise spur is filtered out and the breathing signal remains. In other cases, frequency harmonics and/or other frequency noise in the digital audio signal may fail to satisfy a frequency range criterion, e.g., owing to their occurrence in a frequency range(s) not typically associated with breathing inhalation or exhalation.

Returning to FIG. 7, techniques 700 provide additional optional operation 720 that may occur between block 450 and block 460 from FIG. 4. In particular, at block 720, the system may identify, based on the identified characteristic(s) of the nasal breathing signal, a particular system user that is currently utilizing the system. This user identification process may be based, e.g., on one or more of: an age of the user, a gender of the user, and/or nasal breathing characteristics of the user or other users sharing similar physiological characteristics to the user. In some embodiments, one or more ML-enabled techniques may be used to identify the particular system user. For example, a neural network, such as a convolutional neural network or a recurrent neural network, may be used to identify characteristics of the nasal breathing signal and determine a correspondence between the identified characteristics and the particular system user Next, block 730 provides additional detail to block 460 of FIG. 4 and block 630 from FIG. 6. In particular, block 730 discusses the scenario wherein the gain applied to the analog audio signal may be adjusted to compensate for a change in position of a nose-piece to which an ultrasonic microphone for recording the user's breathing is affixed. For example, if the nose-piece (and, by extension, ultrasonic microphone) is shifted farther away from the user's nose, then a larger gain may need to be applied to the audio signal in order to more successfully extract the aforementioned characteristics of the user's nasal breathing from the breathing audio signal.

Next, block 740 provides additional detail to block 460 from FIG. 4. In particular, block 740 discusses the scenario wherein the system provides the current user a response based on the identified characteristic of the nasal breathing. For example, if the user's breathing is too fast, the response may be to indicate to the user to calm down and slow their breathing. If the user's breathing is not consistent, the response may be to provide count-ups or count-downs for the user's inhalation or exhalation breathing phases.

Figure 9:
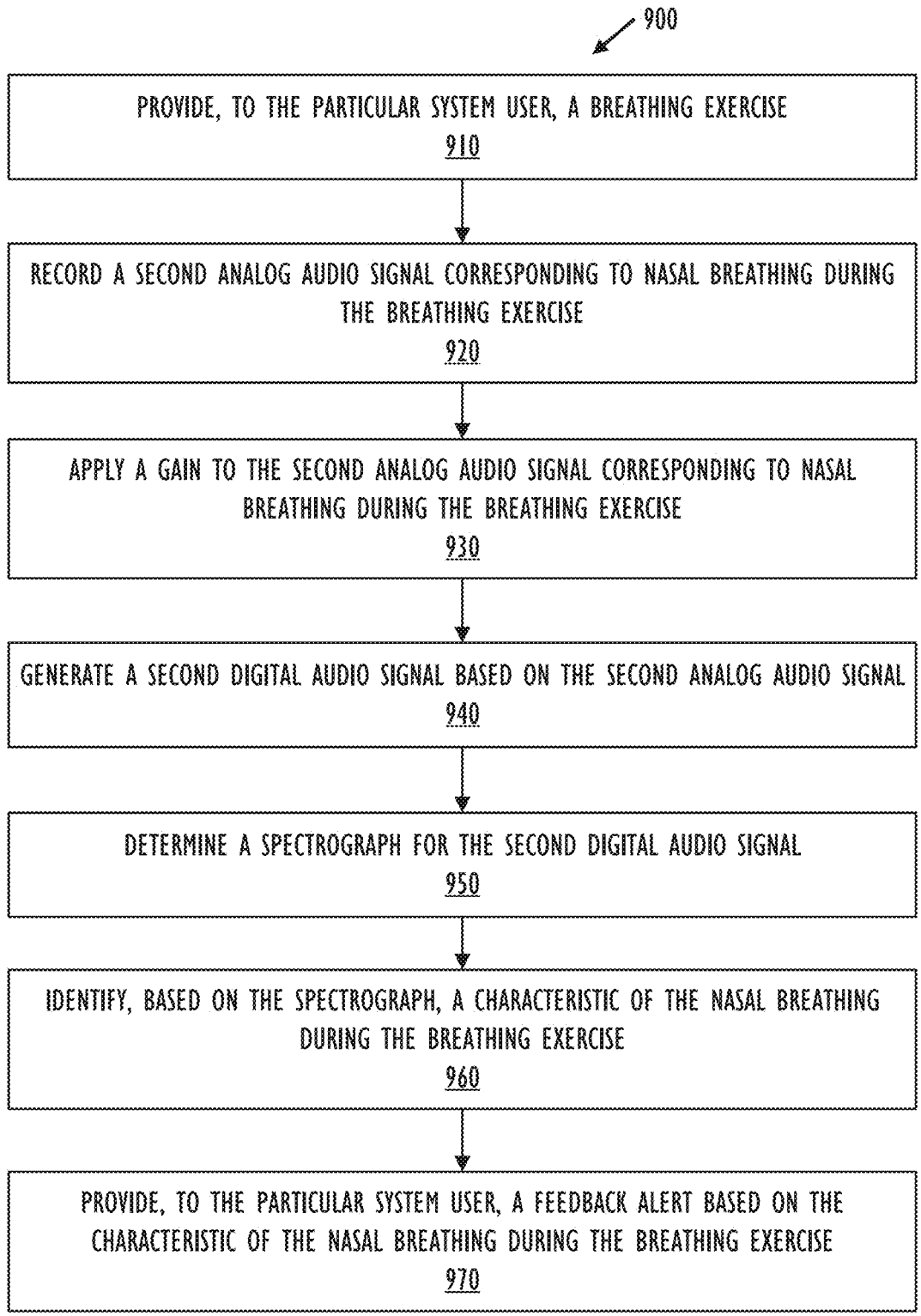
FIG. 9 shows, in flow chart form, an example technique for providing a breathing exercise to a user of a wearable device having an ultrasonic transducer, according to one or more embodiments.

FIG. 9 shows, in flow chart form, an example technique 900 for providing a breathing exercise to a particular system user of a wearable device having an ultrasonic transducer, according to one or more embodiments. First, at block 910, a breathing exercise may be provided to a particular system user (e.g., a meditation or relaxation exercise). In some implementations, the technique 400 described with respect to FIG. 4 is performed first, and the breathing exercise may be chosen based on the characteristic of the nasal breathing. Next, at block 920, a second analog audio signal corresponding to nasal breathing may be recorded during the breathing exercise. As discussed above with respect to FIG. 4, e.g., beginning at block 420, if so desired, a gain may be applied to the second analog audio signal corresponding to nasal breathing during the breathing exercise (block 930), and a second digital audio signal may be generated based on the second analog audio signal (block 940). At block 950, a spectrograph may be determined for the second digital audio signal. At block 960, the technique may identify, based on the spectrograph, a characteristic of the nasal breathing during the breathing exercise. Finally, at block 970, the device may provide, to the particular system user of the device, a feedback alert based on the characteristic of the nasal breathing during the breathing exercise (e.g., speed up breathing, slow down breathing, focus, exhale through mouth instead, etc.).

Figure 10:
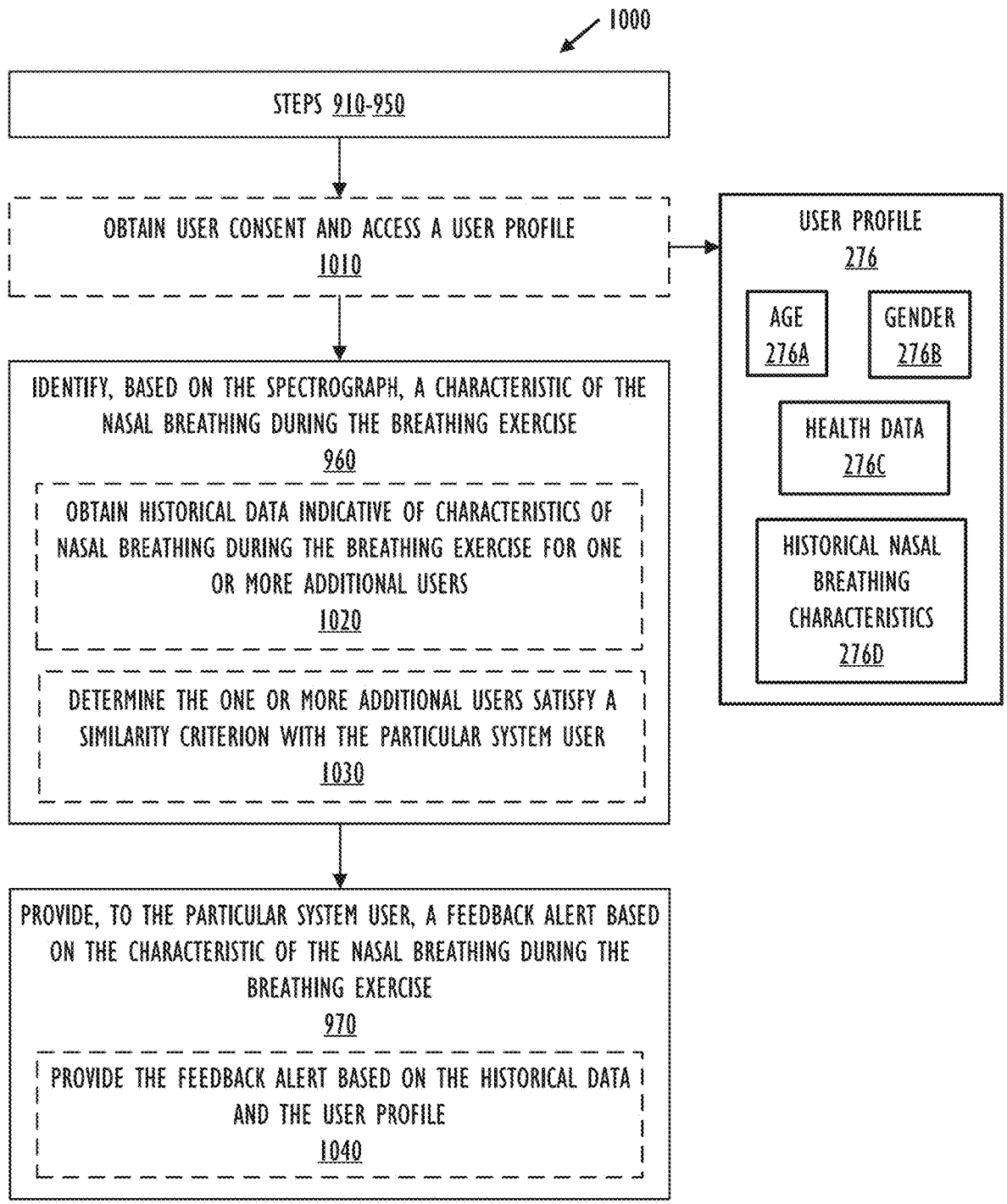
FIG. 10 shows, in flow chart form, additional techniques for providing a breathing exercise to a user of a wearable device having an ultrasonic transducer, according to one or more embodiments.

FIG. 10 shows, in flow chart form, additional techniques 1000 for providing a breathing exercise to a user of a wearable device having an ultrasonic transducer, according to one or more embodiments. Block 1010 provides additional detail related to an optional processing operation that may occur between blocks 950 and 960 from FIG. 9. In particular, block 1010 provides that the device may obtain user consent and access a user profile (276) prior to beginning the analysis of the spectrograph of the user's breathing signal. As discussed above, with reference to FIG. 2B, the user profile 276 may comprise multiple elements related to the user, e.g.: the user's age (276A), gender (276B), relevant health data (276C), e.g., underlying respiratory conditions, and/or data related to historical nasal breathing characteristics of the user (276D).

Blocks 1020 and 1030 provide additional detail related to optional processing operations that may occur as part of block 960 from FIG. 9. In particular, at block 1020, the techniques may obtain historical data indicative of characteristics of nasal breathing during the breathing exercise for one or more additional users (e.g., users in approximately the particular system user's age range, weight, gender, geography, health condition, etc.). At block 1030, the techniques may further determine the one or more additional users satisfy a similarity criterion with the particular system user. Once additional users satisfying the similarity criterion haven been determined, then the identified characteristic(s) of the particular user's nasal breathing may be compared against analogous characteristics of the similar users. (It is to be understood that the determination of similar users may be performed in a completely anonymous fashion, i.e., with the system having no way of knowing the actual identities of the users whose historical breathing data is being analyzed.)

Finally, block 1040 provides additional detail related to block 970 from FIG. 9. In particular, at block 1040, the feedback alert that is provided to the particular system user may be based on the historical data and/or the user profile, e.g., the alert may be: "Breathing characteristic X is unusual for you," "Breathing characteristic Y is not normal for a Male aged 20-30," "Breathing characteristic Z may be indicative of an illness." etc.

Exemplary Electronic Device

Figure 11:
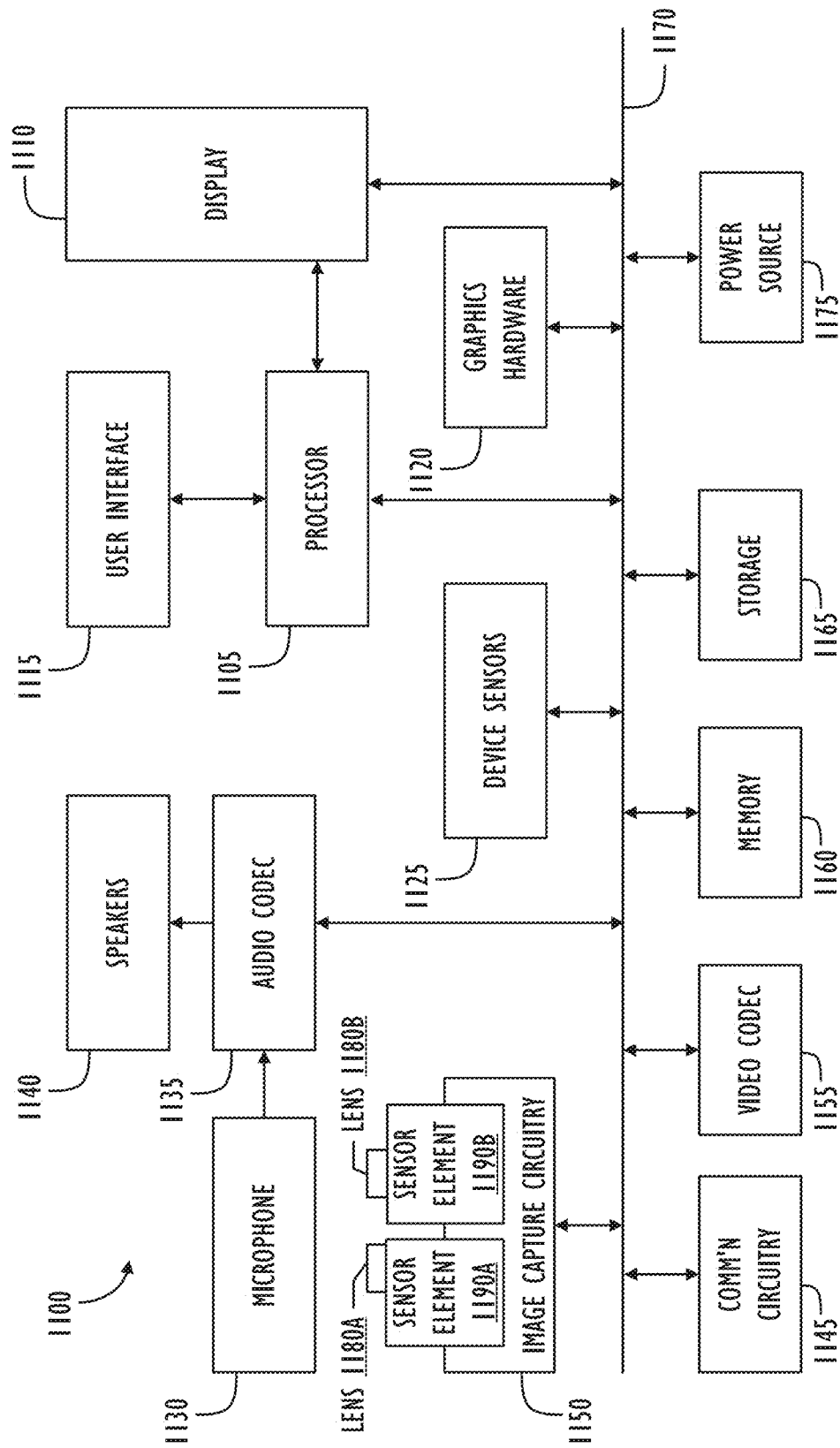
FIG. 11 shows, in block diagram form, a simplified multifunctional device according to one or more embodiments.

Referring now to FIG. 11, a simplified functional block diagram of illustrative multifunction electronic device 1100 is shown according to one embodiment. Multifunction electronic device 1100 may include processor 1105, display 1110, user interface 1115, graphics hardware 1120, device sensors 1125 (e.g., proximity sensor/ambient light sensors, inertial measurement units (IMUs), accelerometers, and/or gyroscopes), microphone 1130, audio codec(s) 1135, speaker(s) 1140, communications circuitry 1145, digital image capture circuitry 1150 (e.g., including a camera system) video codec(s) 1155 (e.g., in support of digital image capture unit), memory 1160, storage device 1165, and communications bus 1170. Multifunction electronic device 1100 may be, for example, a digital camera or a personal electronic device such as a personal digital assistant (PDA), personal music player, mobile telephone, or a tablet computer.

Processor 1105 may execute instructions necessary to carry out or control the operation of many functions performed by electronic device 1100 (e.g., such as the processing of nasal breathing audio signal samples, as disclosed herein). Processor 1105 may, for instance, drive display 1110 and receive user input from user interface 1115. User interface 1115 may allow a user to interact with device 1100. For example, user interface 1115 can take a variety of forms, such as a button, keypad, dial, a click wheel, keyboard, display screen and/or a touch screen. Processor 1105 may also, for example, be a system-on-chip such as those found in mobile devices and include a dedicated graphics processing unit (GPU). Processor 1105 may be based on reduced instruction-set computer (RISC) or complex instruction-set computer (CISC) architectures or any other suitable architecture and may include one or more processing cores. Graphics hardware 1120 may be special purpose computational hardware for processing graphics and/or assisting processor 1105 to process graphics information. In one embodiment, graphics hardware 1120 may include a programmable GPU.

Image capture circuitry 1150 may include two (or more) lens assemblies 1180A and 1180B, where each lens assembly may have a separate focal length. For example, lens assembly 1180A may have a short focal length relative to the focal length of lens assembly 1180B. Each lens assembly may have a separate associated sensor element 1190. Alternatively, two or more lens assemblies may share a common sensor element. Image capture circuitry 1150 may capture still and/or video images. Output from image capture circuitry 1150 may be processed, at least in part, by video codec(s) 1155 and/or processor 1105 and/or graphics hardware 1120, and/or a dedicated image processing unit or pipeline incorporated within circuitry 1165. Images so captured may be stored in memory 1160 and/or storage 1165.

Sensor and camera circuitry 1150 may capture still and video images that may be processed in accordance with this disclosure, at least in part, by video codec(s) 1155 and/or processor 1105 and/or graphics hardware 1120, and/or a dedicated image processing unit incorporated within circuitry 1150. Images so captured may be stored in memory 1160 and/or storage 1165. Memory 1160 may include one or more different types of media used by processor 1105 and graphics hardware 1120 to perform device functions. For example, memory 1160 may include memory cache, read-only memory (ROM), and/or random access memory (RAM). Storage 1165 may store media (e.g., audio, image and video files), computer program instructions or software, preference information, device profile information, and any other suitable data. Storage 1165 may include one more non-transitory computer-readable storage mediums including, for example, magnetic disks (fixed, floppy, and removable) and tape, optical media such as CD-ROMs and digital video disks (DVDs), and semiconductor memory devices such as Electrically Programmable Read-Only Memory (EPROM), and Electrically Erasable Programmable Read-Only Memory (EEPROM). Memory 1160 and storage 1165 may be used to tangibly retain computer program instructions or code organized into one or more modules and written in any desired computer programming language. When executed by, for example, processor 1105 such computer program code may implement one or more of the methods described herein. Power source 1175 may comprise a rechargeable battery (e.g., a lithium-ion battery, or the like) or other electrical connection to a power supply, e.g., to a mains power source, that is used to manage and/or provide electrical power to the electronic components and associated circuitry of electronic device 1100.

The scope of the disclosed subject matter should be determined with reference to the appended claims, along with the full scope of equivalents to which such claims are entitled. In the appended claims, the terms "including" and "in which" are used as the plain-English equivalents of the respective terms "comprising" and "wherein."

The invention claimed is:

1. A system, comprising:
    an ultrasonic transducer affixed to a nose-piece and configured to record an analog audio signal corresponding to nasal breathing;
    an amplifier coupled to the ultrasonic transducer and configured to apply a gain to the analog audio signal;
    an analog-to-digital converter (ADC) coupled to the amplifier and configured to generate a digital audio signal based on the analog audio signal;
    one or more processors; and
    one or more computer readable media comprising computer code executable by the one or more processors to:
        receive, from the ADC, the digital audio signal corresponding to nasal breathing;
        determine, based on the digital audio signal, a spectrograph for the digital audio signal;
        identify, based on the spectrograph, a characteristic of the nasal breathing;
        identify, based on the characteristic of the nasal breathing, a particular system user; and
        adjust, based on the characteristic of the nasal breathing and the identity of the particular system user, a parameter of the system related to processing of audio signals corresponding to nasal breathing.

2. The system of claim 1, wherein the computer code to determine the spectrograph for the digital audio signal comprises computer code executable by the one or more processors to apply a filter to the digital audio signal.

3. The system of claim 2, wherein the computer code to adjust a parameter of the system related to processing of audio signals corresponding to nasal breathing comprises computer code executable by the one or more processors to adjust at least one of: a frequency range of the filter, and a pole of the filter.

4. The system of claim 2, wherein the spectrograph for the digital audio signal has a frequency range that satisfies a first threshold frequency range criterion, and wherein the computer code to apply the filter comprises computer code executable by the one or more processors to filter out frequency spurs having a frequency range that does not satisfy a second threshold frequency range criterion.

5. The system of claim 1, wherein the computer code to adjust a parameter of the system related to processing of audio signals corresponding to nasal breathing comprises computer code executable by the one or more processors to adjust the gain of the amplifier.

6. The system of claim 5, wherein the computer code to adjust the gain of the amplifier comprises computer code executable by the one or more processors to compensate for a change in position of the nose-piece.

7. The system of claim 1, wherein the computer code to adjust a parameter of the system related to processing of audio signals corresponding to nasal breathing comprises computer code executable by the one or more processors to improve a signal-to-noise ratio for the digital audio signal.

8. The system of claim 1, further comprising a user interface, wherein the computer code to adjust a parameter of the system related to processing of audio signals corresponding to nasal breathing comprises computer code executable by the one or more processors to provide, to the particular system user and via the user interface, a response based on the characteristic of the nasal breathing.

9. The system of claim 8, wherein the one or more computer readable media further comprise computer code executable by the one or more processors to:
provide, to the particular system user and via the user interface, a breathing exercise;
receive, from the ADC, a second digital audio signal corresponding to nasal breathing during the breathing exercise;
determine, based on the second digital audio signal, a spectrograph for the second digital audio signal;
identify, based on the spectrograph, a characteristic of the nasal breathing during the breathing exercise; and
provide, to the particular system user and via the user interface, a feedback alert based on the characteristic of the nasal breathing during the breathing exercise.

10. The system of claim 9, wherein the computer code to identify the characteristic of the nasal breathing during the breathing exercise comprises computer code executable by the one or more processors to obtain historical data indicative of characteristics of nasal breathing during the breathing exercise for one or more additional users.

11. The system of claim 10, wherein the computer code to obtain historical data indicative of characteristics of nasal breathing during the breathing exercise for one or more additional users comprises computer code executable by the one or more processors to determine the one or more additional users satisfy a similarity criterion with the particular system user.

12. The system of claim 10, wherein the computer code to provide the feedback alert comprises computer code executable by the one or more processors to provide the feedback alert based on the historical data indicative of characteristics of nasal breathing during the breathing exercise for one or more additional users.

13. A method, comprising:
receiving an analog audio signal corresponding to nasal breathing from an ultrasonic transducer affixed to a nose-piece of a wearable device;
generating a digital audio signal based on the analog audio signal;
determining, based on the digital audio signal, a spectrograph for the digital audio signal;
identifying, based on the spectrograph, a characteristic of the nasal breathing;
identifying, based on the characteristic of the nasal breathing, a particular system user; and
adjusting, based on the characteristic of the nasal breathing and the identity of the particular system user, a parameter of the wearable device related to processing of audio signals corresponding to nasal breathing.

14. The method of claim 13, wherein the analog audio signal comprises an inhale phase and an exhale phase, and wherein identifying, based on the spectrograph, a characteristic of the nasal breathing further comprises:
determining a first portion of the spectrograph corresponding to the inhale phase of the audio signal; and
determining a second portion of the spectrograph corresponding to the exhale phase of the audio signal.

15. The method of claim 14, wherein identifying, based on the spectrograph, a characteristic of the nasal breathing further comprises:
identifying, based on the first portion of the spectrograph, a first characteristic of the inhale phase of the nasal breathing; and
identifying, based on the second portion of the spectrograph, a second characteristic of the exhale phase of the nasal breathing.

16. The method of claim 15, wherein adjusting, based on the characteristic of the nasal breathing, a parameter of the wearable device related to processing of audio signals corresponding to nasal breathing, further comprises:
adjusting a parameter of the wearable device, based on at least one of: the first characteristic and the second characteristic.

17. A non-transitory computer readable medium comprising computer readable code executable by one or more processors to:
receive an analog audio signal corresponding to nasal breathing from an ultrasonic transducer affixed to a nose-piece of a wearable device;
generate a digital audio signal based on the analog audio signal;
determine, based on the digital audio signal, a spectrograph for the digital audio signal;
identify, based on the spectrograph, a characteristic of the nasal breathing;
identify, based on the characteristic of the nasal breathing, a particular system user; and
adjust, based on the characteristic of the nasal breathing and the identity of the particular system user, a parameter of the wearable device related to processing of audio signals corresponding to nasal breathing.

18. The non-transitory computer readable medium of claim 17, further comprising computer readable code executable by the one or more processors to:
obtain historical data indicative of characteristics of nasal breathing for one or more additional users that satisfy a similarity criterion with the particular system user.

19. The non-transitory computer readable medium of claim 17, wherein the computer readable code executable by the one or more processors to identify, based on the spectrograph, a characteristic of the nasal breathing further comprises computer readable code executable by the one or more processors to:
identify, based on the spectrograph, a characteristic of the nasal breathing in real-time.

* * * * *